United States Patent [19]
Van Rens

[11] Patent Number: 5,614,853
[45] Date of Patent: Mar. 25, 1997

[54] DIFFERENTIAL LOAD STAGE WITH STEPWISE VARIABLE IMPEDANCE, AND CLOCKED COMPARATOR COMPRISING SUCH A LOAD STAGE

[75] Inventor: Antonia C. Van Rens, Eindhoven, Netherlands

[73] Assignee: U.S. Philips Corporation, New York, N.Y.

[21] Appl. No.: 642,013

[22] Filed: May 2, 1996

Related U.S. Application Data

[62] Division of Ser. No. 544,495, Oct. 18, 1995, Pat. No. 5,539,339, which is a continuation of Ser. No. 259,948, Jun. 15, 1994, abandoned.

[30] Foreign Application Priority Data

Jun. 17, 1993 [BE] Belgium ............................. 09300619

[51] Int. Cl.[6] ............................. H03K 5/153; G11C 27/02
[52] U.S. Cl. ............................. 327/77; 327/89; 327/96
[58] Field of Search ............................. 327/77, 89, 91, 327/94, 96, 51, 55, 427, 215, 219, 220, 228, 337, 554

[56] References Cited

U.S. PATENT DOCUMENTS

| | | | |
|---|---|---|---|
| 3,573,499 | 4/1971 | Lynes | 327/220 |
| 3,849,675 | 11/1974 | Waaben | 327/220 |
| 4,053,873 | 10/1977 | Freeman et al. | 327/51 |
| 4,546,324 | 10/1985 | Bingham et al. | 327/91 |
| 5,124,593 | 6/1992 | Michel | 327/554 |
| 5,311,085 | 5/1994 | Pelgrom et al. | 327/65 |
| 5,381,053 | 1/1995 | Yasuda | 327/77 |

OTHER PUBLICATIONS

B.S. Song & M.F. Tompsett, "A 10b 15MHz Recycling Two-Step A/D Converter", ISSCC 90, Feb. 15, 1990, Imperial Ballroom, 1:30 PM, Session 10: Analog-To-Digital Converters, pp. 158–159, 289.

*Primary Examiner*—Toan Tran
*Attorney, Agent, or Firm*—Laurie E. Gathman

[57] ABSTRACT

A clocked comparator having an input differential amplifier, a sample and hold circuit, and a load stage. The load stage including a first transistor whose channel is connected between a first terminal and a first node, a second transistor whose channel is connected between a second terminal and a second node, a third transistor whose channel is connected between the first node, a third terminal and a fourth transistor whose channel is connected between the second node and the third terminal and a switch between the first and the second terminal. The gates of the first and the fourth transistor are connected to the first terminal. The gates of the second and the third transistor are connected to the second terminal. When the switch is closed the first and the second transistor form a positive differential impedance between the first and the second terminal. When the switch is open the cross-coupled third and fourth transistors form a negative differential impedance between the first and the second terminal.

1 Claim, 7 Drawing Sheets

DIFFERENTIAL LOAD STAGE WITH STEPWISE VARIABLE IMPEDANCE, AND CLOCKED COMPARATOR COMPRISING SUCH A LOAD STAGE

This is a division of application Ser. No. 08/544,495 filed Oct. 18, 1995 now U.S. Pat. No. 5,539,339 which is a continuation of Ser. No. 08/259,948, filed Jun. 15, 1994, abandoned.

BACKGROUND OF THE INVENTION

1. Field of the Invention

The invention relates to a load stage comprising:
a first, a second and a third terminal;
a first transistor having a gate, which is coupled to the first terminal, a source, a drain and a main current path between the source and the drain, which main current path is included in a current path between the first terminal and the third terminal;
a second transistor having a gate, which is coupled to the second terminal, a source, a drain and a main current path between the source and the drain, which main current path is included in a current path between the second terminal and the third terminal;
a third transistor having a gate, which is coupled to the second terminal, a source, a drain and a main current path between the source and the drain, which main current path is included in a current path between the first terminal and the third terminal;
a fourth transistor having a gate, which is coupled to the first terminal, a source, a drain and a main current path between the source and the drain, which main current path is included in a current path between the second terminal and the third terminal; and
switching means for selectively connecting the main current path of the first transistor and the main current path of the third transistor between the first and the third terminal and for selectively connecting the main current path of the second transistor and the main current path of the fourth transistor between the second and the third terminal.

The invention also relates to a clocked comparator comprising such a load stage.

2. Description of the Related Art

Such a load stage is known from a paper by B. S. Song and M. F. Tompsett, "A 10b 15 Mhz Recycling Two-Step A/D Converter", published in the Digest of Technical Papers, 1990 IEEE International Solid-State Circuits Conference, pp. 158–159. The known load stage is used in a clocked comparator. In a first phase of a clock signal the comparator operates as a differential amplifier, the impedance of the load stage being positive. In a second phase of the clock signal the comparator operates as a latching circuit, the impedance of the load stage being negative. In the known load stage the first and the second transistor are connected as diodes and their sources can be connected to the third terminal by a switching transistor, said third terminal being connected to earth. The gates of the third and the fourth transistor are cross-coupled to the drains of the third and the fourth transistor and the sources are connected to the third terminal via a permanently conductive switching transistor. The set with the cross-coupled third and fourth transistors forms a permanent negative differential impedance between the first and the second terminal. The other set with the diode-connected first and second transistors forms a positive differential impedance between the first and the second terminal, which is arranged in parallel with the negative differential impedance in the first phase of the clock signal.

A disadvantage of this known method of changing over the differential impedance is that the common-mode voltage on the first and second terminals is also varied by turning on and turning off the first and the second transistor. This is because the common-mode current will be distributed over both transistor sets in the first phase of the clock signal and over only one transistor set in the second phase. The shift in common-mode voltage may give rise to an undesired differential voltage component if the first and second terminals have unequal capacitive loads and may thereby adversely affect the accuracy of the clocked comparator.

SUMMARY OF THE INVENTION

It is one of the objects of the invention to provide a load stage in which the common-mode voltage is not shifted when the differential impedance between the first and second terminals is changed over.

According to the invention the load stage of the type defined in the opening paragraph is therefor characterised in that the main current path of the first transistor and the main current path of the third transistor are arranged in series between the first and the third terminal, the main current path of the first transistor and the main current path of the third transistor being coupled to one another in a first node; the main current path of the second transistor and the main current path of the fourth transistor are arranged in series between the second and the third terminal, the main current path of the second transistor and the main current path of the fourth transistor being coupled to one another in a second node; and the switching means comprise a switch connected between the first and the second node.

In the load stage in accordance with the invention the main current paths of the transistors of the cross-coupled transistor set and the main current paths of the other transistor set are arranged in series. In the case of suitably selected transistor geometries it is possible to change over form a negative to a positive differential impedance by means of the switch. The switch forms a cross connection which does not affect the common-mode current but which influences the differential current. The magnitude of the positive and negative impedances is determined by the ratios of the transistor geometries of the transistor sets.

It may be desirable to have the possibility of switching the impedance of the load stage between more than two positive and/or negative values. In order to achieve this an embodiment of a load stage in accordance with the invention is further characterised in that in at least one set of a first set formed by the first and the second transistor and a second set formed by the third and the fourth transistor a main current path of a further transistor is included in series with the main current path of each of the respective transistors of the at least one set and is connected thereto in a respective node, which further transistor has a gate connected to the gate of the respective transistor with which the further transistor is arranged in series, and a further switch is connected between the respective nodes in the at least one set.

The transistors in one of the sets or in both sets are now formed by a plurality of transistors having their main current paths arranged in series. Switches for making additional cross connections are arranged between the nodes of the main current paths. This makes it possible, for example, to realise an amplifier whose gain is variable in steps.

BRIEF DESCRIPTION OF THE DRAWINGS

These and other aspects of the invention will now be described and elucidated with reference to the accompanying drawings, in which.

In these Figures parts having the same function or purpose bear the same references.

DETAILED DESCRIPTION OF THE PREFERRED EMBODIMENTS

Figure 1:
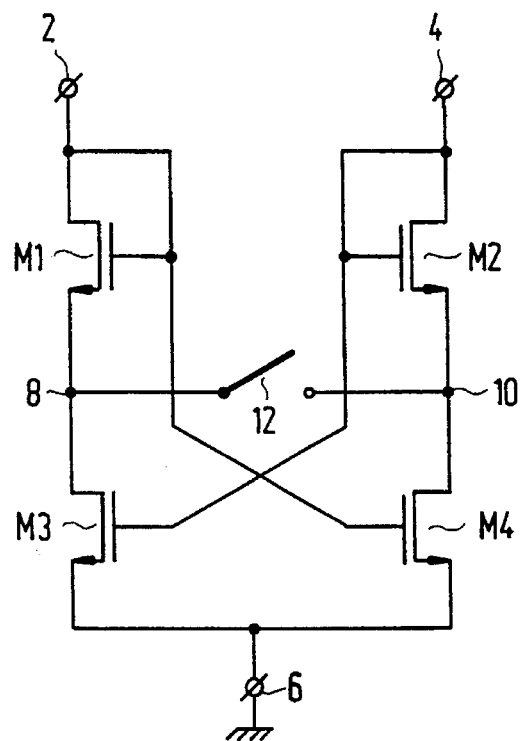
FIG. 1 shows a first embodiment of a load stage in accordance with the invention.

FIG. 1 shows a load stage in accordance with the invention. The load stage is connected between a first terminal 2, a second terminal 4 and a third terminal 6. The third terminal 6 is connected to earth. The first terminal 2 and the second terminal 4 form the input terminals of the load stage. The load stage comprises a first transistor M1, a second transistor M2, a third transistor M3 and a fourth transistor M4, which each have a gate, a source and a drain, a main current path being disposed between the source and the drain, which main current path is also referred to as a channel. The main current paths of the transistors M1 and M3 are arranged in series between the first terminal 2 and the third terminal 6 and are interconnected in a first node 8. The drain and the gate of the transistor M1 are connected to the first terminal 2, the source of the transistor M1 and the drain of the transistor M3 are connected to the first node 8, the gate of the transistor M3 is connected to the second terminal 4, and the source of the transistor M3 is connected to the third terminal 6. Likewise, the main current paths of the transistors M2 and M4 are arranged in series between the second terminal 4 and the third terminal 6 and are interconnected in a second node 10. The drain and the gate of the transistor M2 are connected to the second terminal 4, the source of the transistor M2 and the drain of the transistor M4 are connected to the second node 10, the gate of the transistor M4 is connected to the first terminal 2, and the source of the transistor M4 is connected to the third terminal 6. Seen from the terminals 2 and 4 the transistors M1 and M2 form a set of diode-connected transistors with a positive impedance, which set is arranged in series with a set of cross-coupled transistors M3 and M4 operating in the resistance region. The impedance of the transistors M3 and M4 is negative if the sensitivity to their gate-source voltage is higher than the sensitivity to their drain-source voltage. A switch 12, which can be opened and closed, is arranged between the nodes 8 and 10. When the switch 12 is closed the differential resistance between the terminals 2 and 4 is positive and equal to the sum of the resistances of the transistors M1 and M2 and of the switch 12. The common-mode component of the signal on the terminals 2 and 4 flows from the terminal 2 to the terminal 6 via the series arrangement of the transistors M2 and M4 and from the terminal 4 to the terminal 6 via the series arrangement of the transistors M2 and M4. This is not influenced by opening and closing of the switch 12 so that the common-mode voltage on the terminals 2 and 4 is not changed by opening and closing of the switch 12. When the switch 12 is open the differential resistance between the terminals 2 and 4 is determined by the ratio of the dimensions of the transistor pairs M1/M2 and M3/M4, as will be explained hereinafter.

Figure 2:
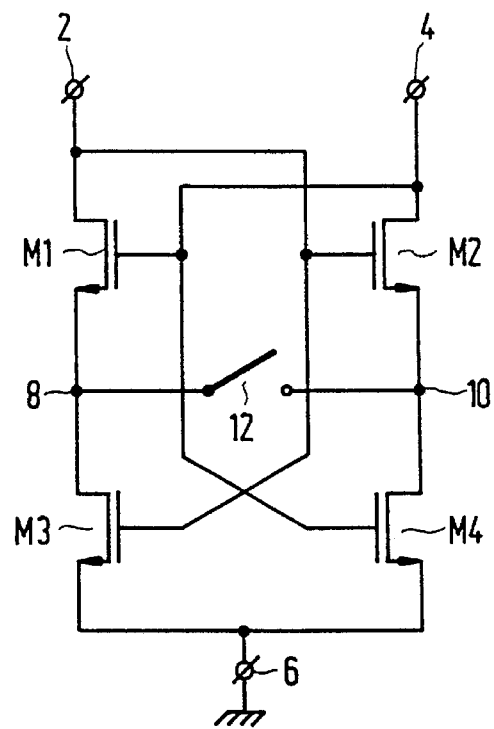
FIG. 2 shows a second embodiment of a load stage in accordance with the invention.

FIG. 2 shows an alternative arrangement of the four transistors M1–M4. The transistors M1 and M3 have been interchanged and the transistors M2 and M4 have been interchanged. Instead of the transistors M3 and M4 the transistors M1 and M2 are now cross-coupled as seen from the terminals 2 and 4. In this variant the differential impedance between the terminals is negative if the switch 12 is closed.

Figure 3:
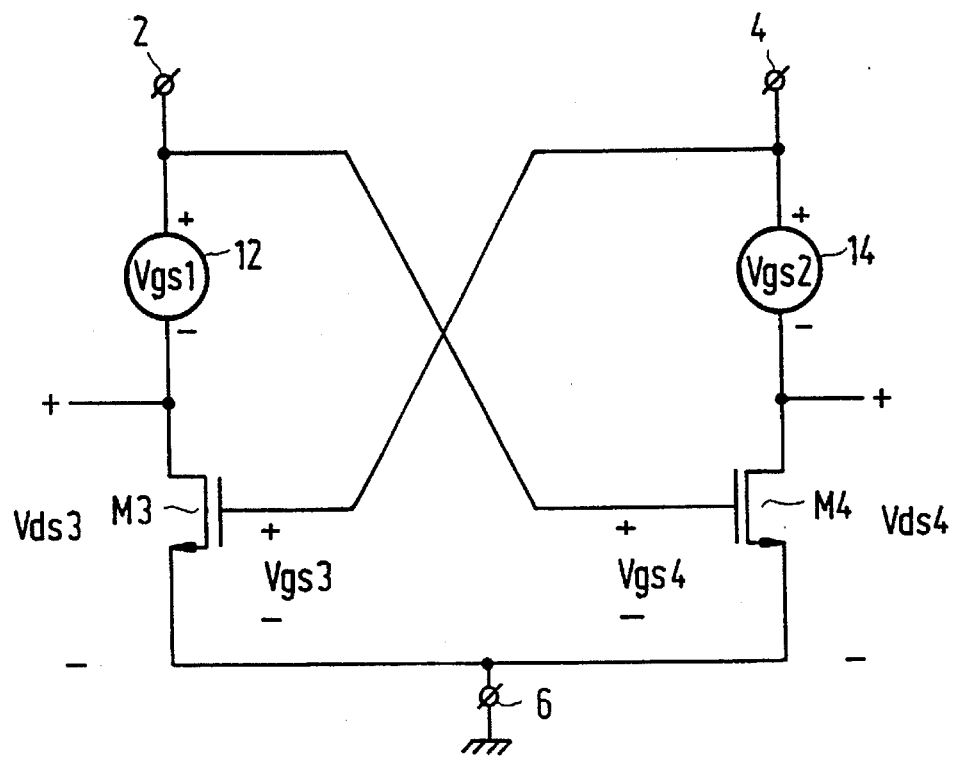
FIG. 3 is a diagram to explain the operation of the first embodiment shown in FIG. 1.

The impedance behaviour of the load stage of FIG. 1 when the switch 12 is open will now be explained in detail. The transistors M1 and M2 operate in the saturation region and the transistors M3 and M4 operate in the linear region. For simplicity the transistors M1 and M2 have been replaced by a source 12 of a voltage Vgs1 and a source 14 of a voltage Vgs2, Vgsi being the gate-source voltage of a transistor Mi. The impedance 1/gm1 of the transistor M1 and the impedance 1/gm2 of the transistor M2 are ignored for the time being, gmi being the transconductance of the transistor Mi. FIG. 3 further shows the gate-source voltage Vgs3 and the drain-source voltage Vds3 of the transistor M3 and the gate-source voltage Vgs4 and the drain-source voltage Vds4 of the transistor M4. Now the following relationships apply:

$$V_{gs1}=V_{gs4}-V_{ds3} \tag{1}$$

$$V_{gs2}=V_{gs3}-V_{ds4} \tag{2}$$

In a balanced situation the voltage difference between the terminals 2 and 4 is substantially zero, so that Vgs1=Vgs2= Vgsp for the two upper transistors M1 and M2 and Vds3= Vds4=Vdsq and Vgs3=Vgs4=Vgsq for the two lower transistors M3 and M4. Formulas (1) and (2) may then be combined, yielding:

$$V_{gsp}=V_{gsq}-V_{dsq} \tag{3}$$

This may be written as:

$$V_{gtp}=V_{gtq}-V_{dsq} \tag{4}$$

where Vgt=Vgs−Vt is the effective control voltage and Vt is the threshold voltage of the relevant transistor, the threshold voltages Vtp and Vtq being assumed to be equal. The current through the transistors M3 and M4 is given by:

$$I=Bq*(Vgtq-Vdsq/2)*Vdsq \quad (5)$$

Here, $Bq=Wq/Lq*B0$ is the current gain factor, Wq being the channel width and Lq being the channel length of the transistors M3 and M4 and B0 being the current gain of a square transistor.

Figure 4:
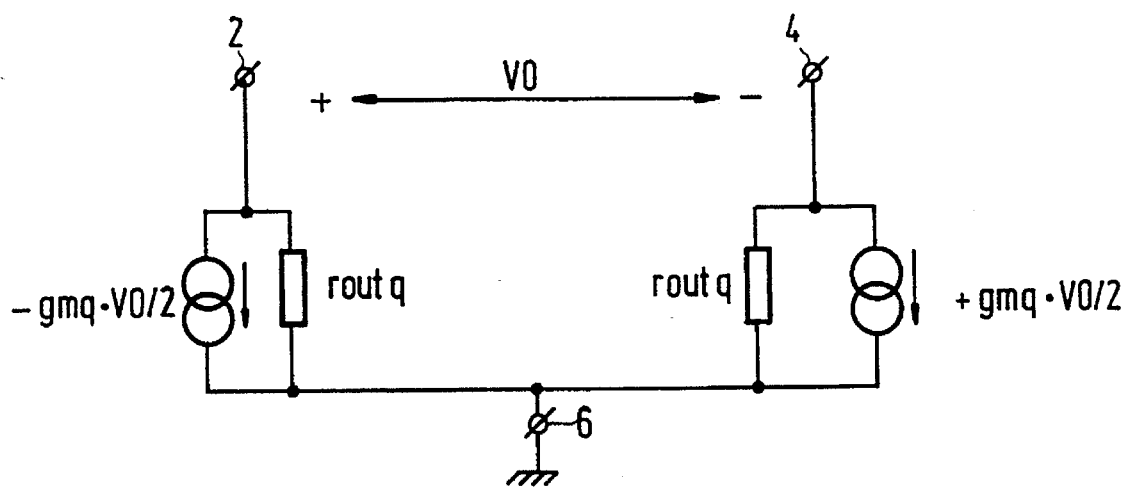
FIG. 4 is an electrical equivalent diagram to explain the operation of the first embodiment shown in FIG. 1.

For small signals the transistors M3 and M4 may be replaced by a voltage-controlled current source and a resistor, as is shown in FIG. 4. The transistor M3 has been replaced by a source of a current $-gmq*vo/2$ in parallel with a resistor of a value routq and the transistor M4 has been replaced by a source of a current $+gmq*vo/2$ in parallel with a resistor of a value routq, where gmq is the transconductance of the transistors M3 and M4 and vo is the voltage difference between the terminals 2 and 4. The transconductance of the current sources is equal to the transconductance (gmq) of the equivalent transistor, which complies with:

$$gmq=dI/dVgsq=Bq*Vdsq \quad (6)$$

As a result of the cross-coupling of the gates of the transistors M3 and M4 the sign of the current is opposite to the sign of the voltage vo. The resistors represent the output or channel impedance of the transistors M3 and M4. The reciprocal or conductance (1/routq) may be written as:

$$1/routq=dI/dVdsq=Bq*(Vgtq-Vdsq)=Bq*Vgtp \quad (7)$$

The overall output conductance Gout between the terminals 2 and 4 is:

$$Gout=1/routq-gmq=Bq*(Vgtp-Vdsq) \quad (8)$$

or, using formula (3):

$$Gout=Bq*(Vgtq-2*Vdsq) \quad (9)$$

Figure 5:
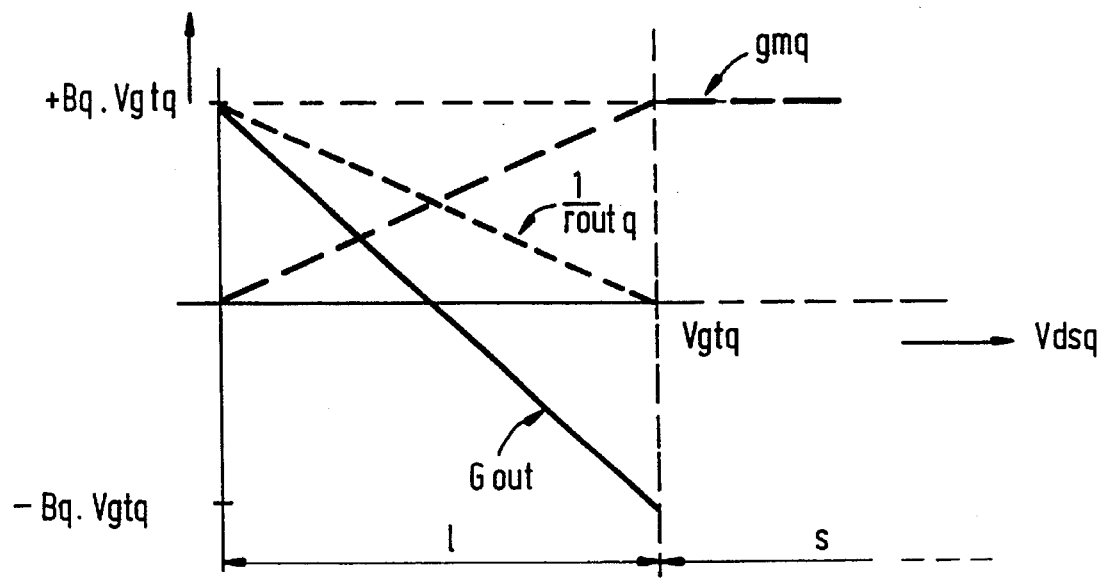
FIG. 5 is a first diagram showing graphs of some parameters of the first embodiment shown in FIG. 1.

FIG. 5 is a graph of qmq, 1/routq and Gout as function of Vdsq. If Vdsq is greater than Vgtq the transistor is saturated (region s) and 1/routq is zero and gmq=Bq*Vgtq. In practice, Vgtp is always greater than zero, so that the transistors M3 and M4 operate in the linear region (region 1). The overall output conductance Gout is determined by the difference between the channel conductance 1/routq and the transconductance gmq: if 1/routq is greater than qmq then Gout will be positive, if 1/routq is smaller than gmq then Gout will be negative, and if 1/routq is equal to gmq then Gout will be zero and the input impedance between the terminals 2 and 4 will be infinite.

Formula (5) gives the current I as a function of Bq, Vgtq and Vdsq. By means of formula (4) Vdsq can be expressed in Vgtp, I and Bq. The result can be inserted in formula (8) to express the output conductance Gout in terms of Vgtp, I and Bq:

$$Gout=Bq*(2*Vgtp-\sqrt{(Ggtp^2+2I/Bq)}) \quad (10)$$

For a given I and Bq the output impedance can be adjusted by Vgtp. In reality there is no voltage source but a transistor, i.e. M1 or M2, operating in the saturation mode. The voltage Vgtp is determined by the current I through the transistors M1 and M2 and the current gain Bp of these transistors:

$$I=(Bp/2)*Vgtp^2 \text{ or } Vgtp=\sqrt{(2*I/Bp)} \quad (11)$$

Substitution of formula (11) in formula (10) yields:

$$Gout=\sqrt{(2*I*Bq)}*(2*\sqrt{(Bq/Bp)}-\sqrt{(Bq/Bp+1)}) \quad (12)$$

Figure 6:
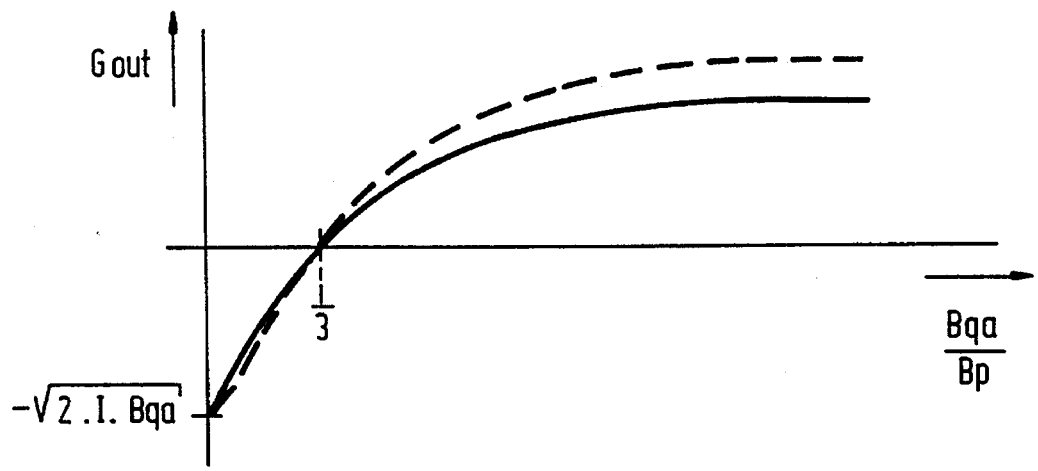
FIG. 6 is a second diagram showing graphs of some parameters of the first embodiment shown in FIG. 1.

The broken line in FIG. 6 represents the overall output conductance Gout as function of 1/Bp, where Bq has a selected fixed value Bqa.

So far, the influence of the impedance 1/gmp of the transistors M1 and M2 has been ignored. If allowance is made for these impedances a resistor having a value equal to 1/gmp should be arranged in series with the terminals 2 and 4 in the equivalent diagram shown in FIG. 4. This impedance 1/gmp can be written as:

$$1/gmp=1/\sqrt{(2*I*Bp)}=1/(Bp*Vgtp)=Bq/Bp*routq \quad (13)$$

The current through the parallel resistor of the value routq in FIG. 4 is then no longer determined by the voltage vo on the terminals 2 and 4 but by the voltage difference between the terminals 8 and 10. The current supplied by the current source having the transconductance qmq, however, is still determined by the voltage vo. Taking into account the impedance 1/gmp of the transistors M1 and M2 the overall output conductance Gout can be written as:

$$Gout=\sqrt{(2*I*Bp)}*(2-\sqrt{(Bp/Bq+1)})/(Bp/Bq+1) \quad (14)$$

The result is represented as a solid line in FIG. 6. If Bq/Bp is much smaller than 1 or if the overall output conductance Gout is small (Bq/Bp=1/3) the effect of the series impedance 1/gmp will be slight.

Figure 7:
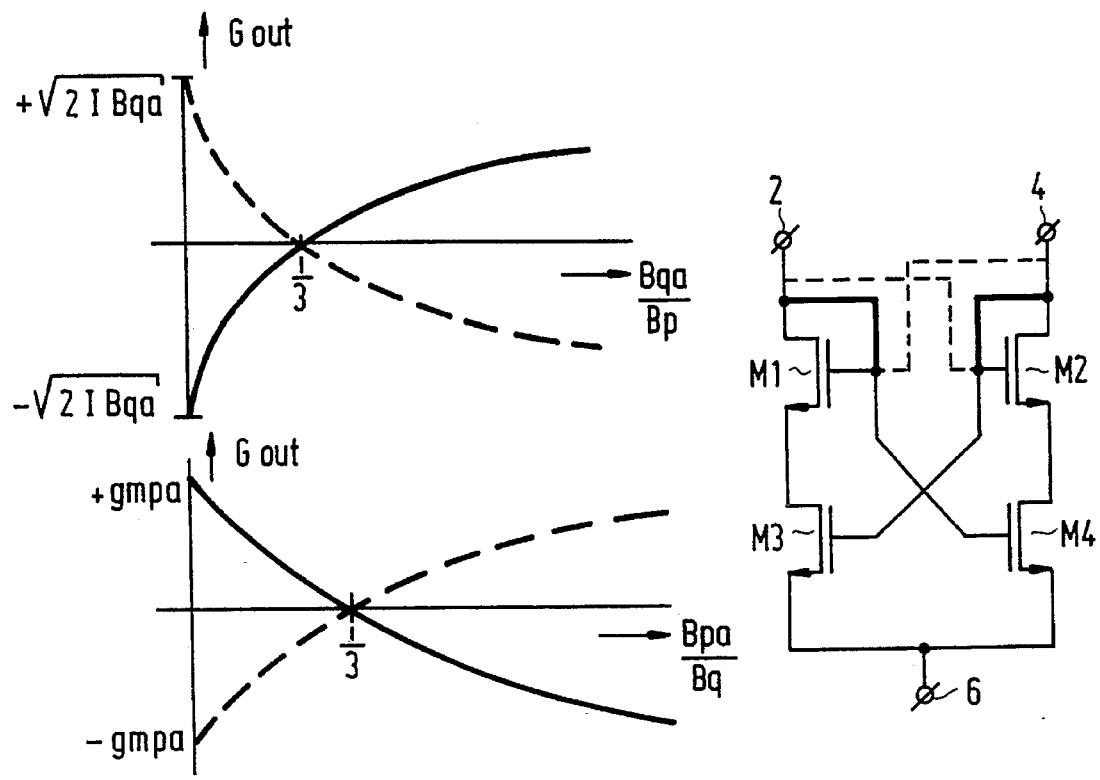
FIG. 7 shows a diagram representing graphs of some parameters of the first embodiment shown in FIG. 1 and of the second embodiment shown in FIG. 2, and a combined circuit diagram of the two embodiments.

Thus, the output conductance Gout appears to be dependent on the ratio between the current gain factor Bp of the transistors M1 and M2 and the current gain factor Bq of the transistors M3 and M4. It is then possible either to keep Bp constant at a value Bqa, as is illustrated by the upper solid curve in FIG. 7, or to keep Bq constant at a value Bpa, as is illustrated by the lower solid curve in FIG. 7. In the last-mentioned case, owing to equation (13), Gout as a function of 1/Bq can be expressed in the transconductance gmp of the transistors M1 and M2. FIG. 7 further shows the corresponding curves in broken lines for the case that the transistors are arranged as shown in FIG. 2.

In practice, the curves for Gout shown in FIGS. 5, 6 and 7 exhibit some deviations, inter alia as a result of the back-gate effect and the finite output impedance of a transistor operating in the saturation region. Moreover, the transition between 1/gmq and 1/routq is less abrupt than shown in FIG. 5.

Figure 8:
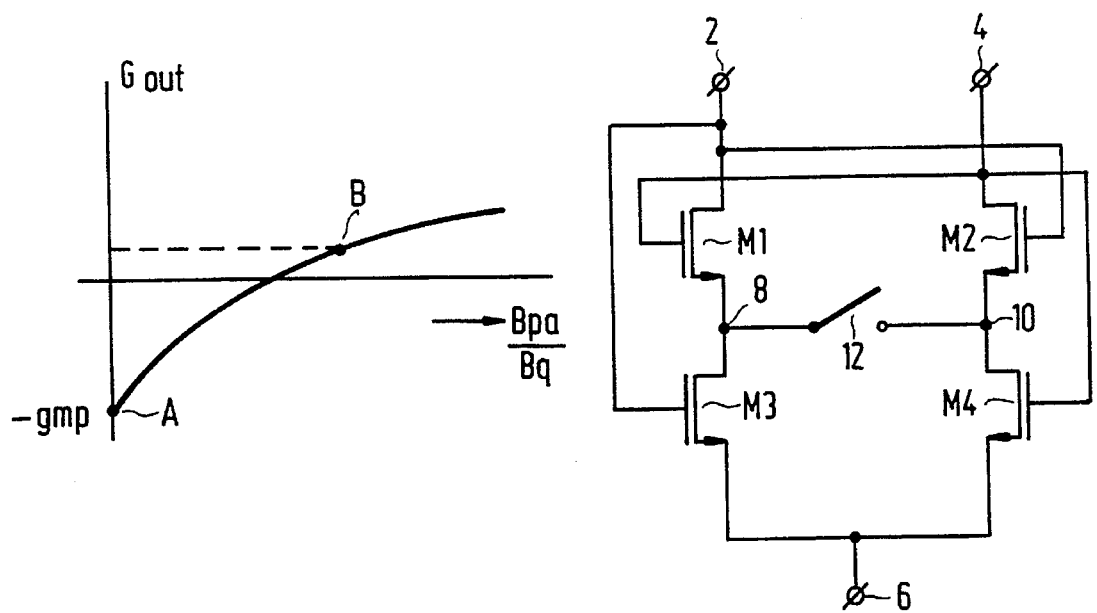
FIG. 8 shows a diagram representing graphs of some parameters of the second embodiment shown in FIG. 2, and a circuit diagram of the second embodiment.

FIG. 8 illustrates the effect of the switch 12 in a load stage of the configuration shown in FIG. 2. If the switch 12 is open the output conductance is determined by the ratio of the current gain factors Bp and Bq, as is indicated in point B of the curve. Depending on the selected current gain factors the output conductance can be positive, negative or zero in point B. If the switch 12 is closed the effect of the transistors M3 and M4 is cancelled and the output conductance is equal to the conductance $-gm1$ of the transistors M1 and M2, point A in the curve.

Figure 9:
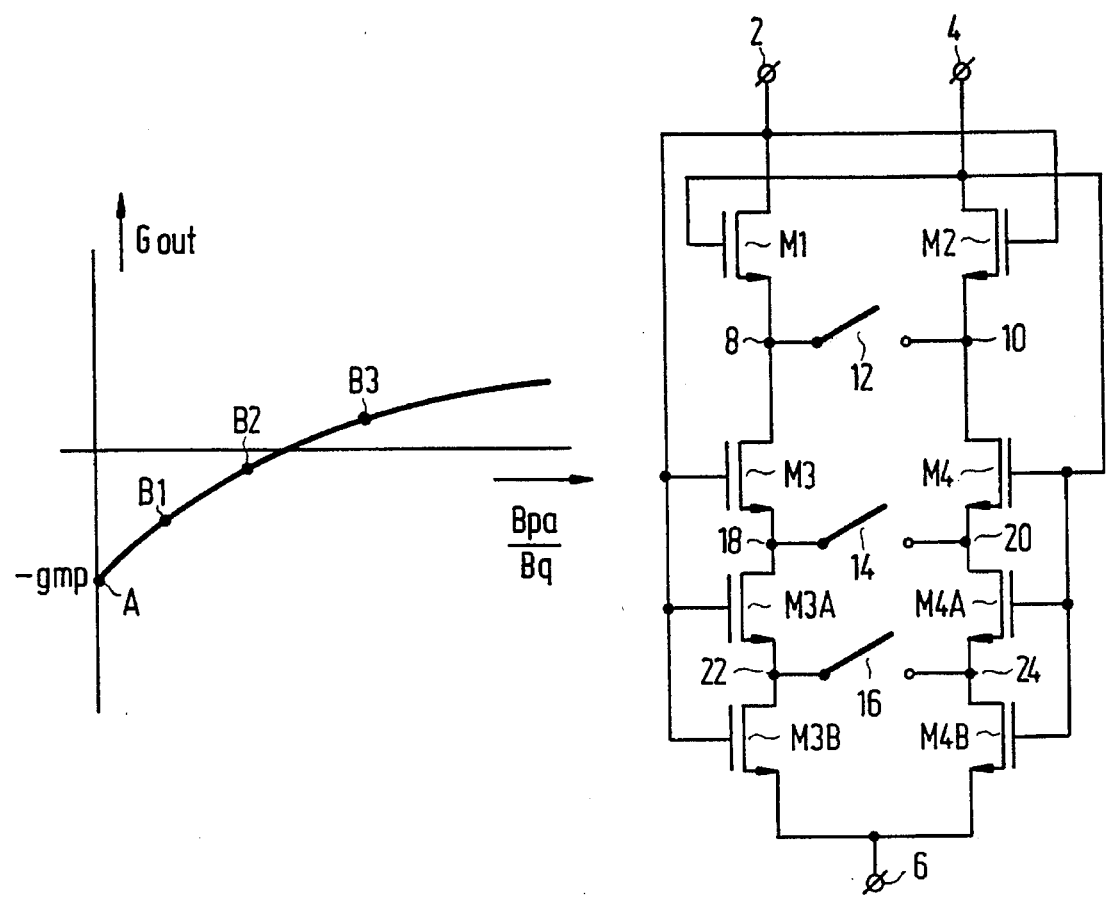
FIG. 9 shows a diagram representing graphs of some parameters of an elaborate embodiment based on the embodiment shown in FIG. 2, and a circuit diagram of the elaborated embodiment.

In FIG. 9 two further transistors M3A and M3B are arranged in series with the transistor M3 and have their gates connected to the gate of the transistor M3. The main current paths of the transistors M3 and M3A are interconnected in a further node 18 and the main current paths of the transistors M3A and M3B are interconnected in a further node 22. The transistor M4 forms a similar arrangement with the further transistors M4A and M4B and the further nodes 20 and 24. The nodes 18 and 20 may be interconnected by a further switch 14 and the nodes 22 and 24 may be interconnected by a further switch 16. This enables the number of conductance values to be increased. Point B3 in the curve is reached if all the switches are open, point B2 if the switch 16 is closed, point B1 if the switch 14 is closed, and point A if the switch 12 is closed. By means of the switches 14 and 16 the effective length L of the series transistors M3/M3A/M3B and M4/M4A/M4B and, consequently, their current gain factor B, is varied in steps.

Figure 10:
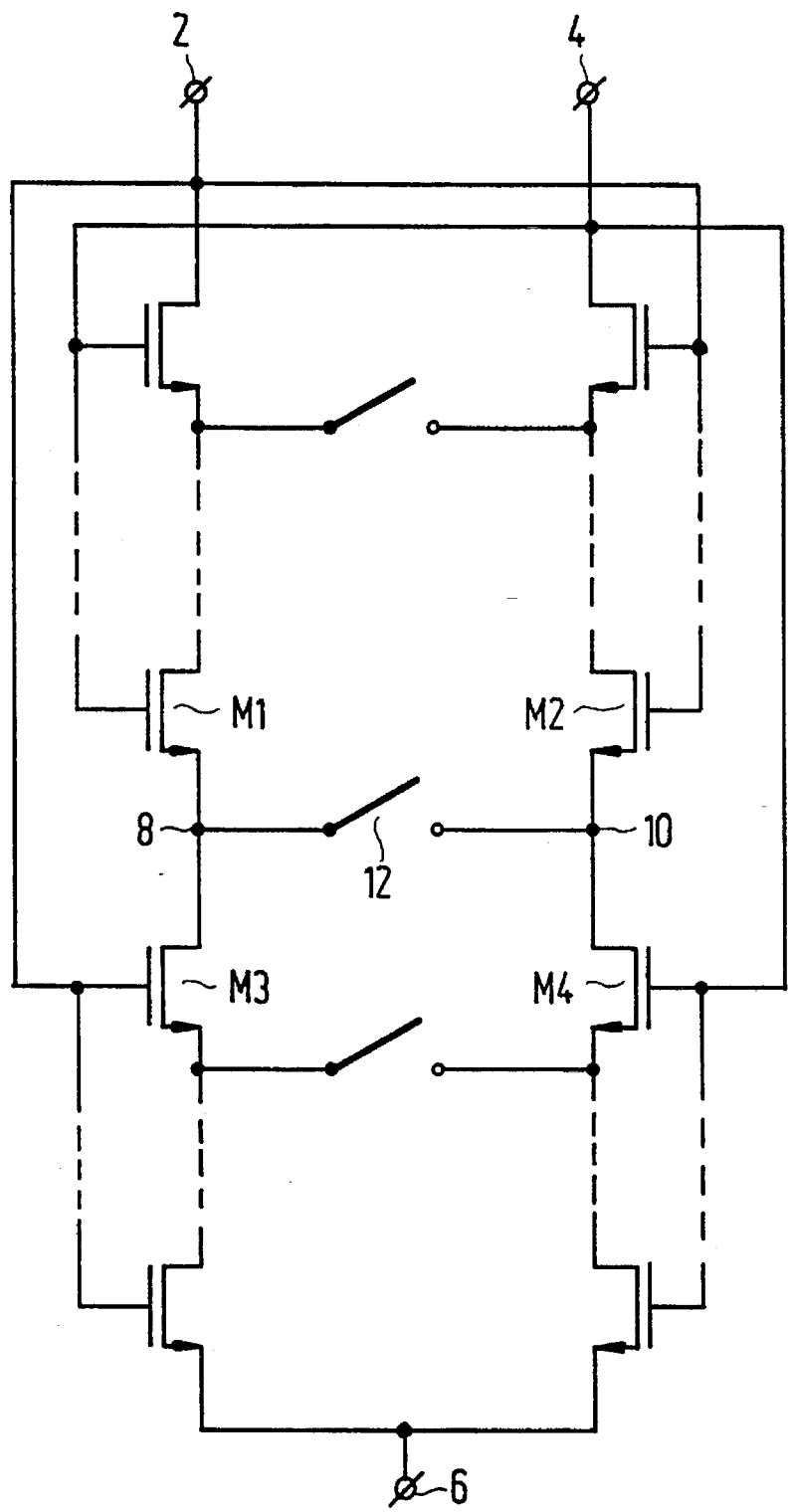
FIG. 10 is a circuit diagram of a general embodiment of a load stage in accordance with the invention.

The transistors M1 and M2 may be provided with additional series transistors and additional switches in a similar manner, as is shown in FIG. 10. In this way the number of possible conductance values is increased even further. The effective current gain factor in each of the two transistor cells is determined by the number of transistors situated above the upper closed switch.

Figure 11:
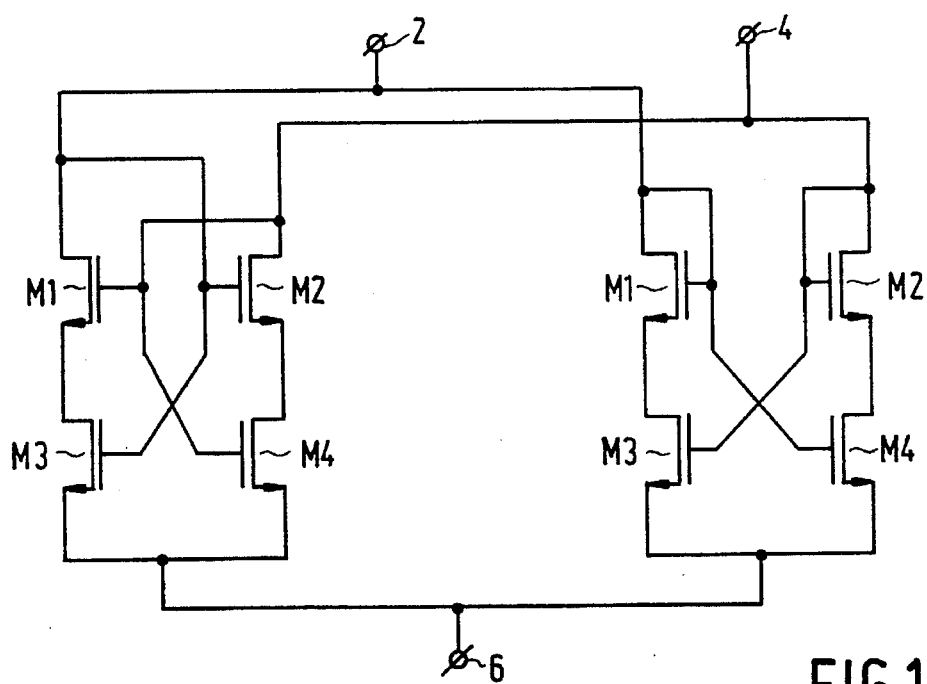
FIG. 11 shows a further embodiment of a load stage in accordance with the invention.

The two variants of the load stages shown in FIG. 7 have equal conductances but of opposite sign. Arranging the two variants in parallel as shown in FIG. 11 yields a parallel conductance which is substantially equal to zero if the two variants have identical transistors. The differential impedance between the terminals 2 and 4 is then substantially infinite.

Figure 12:
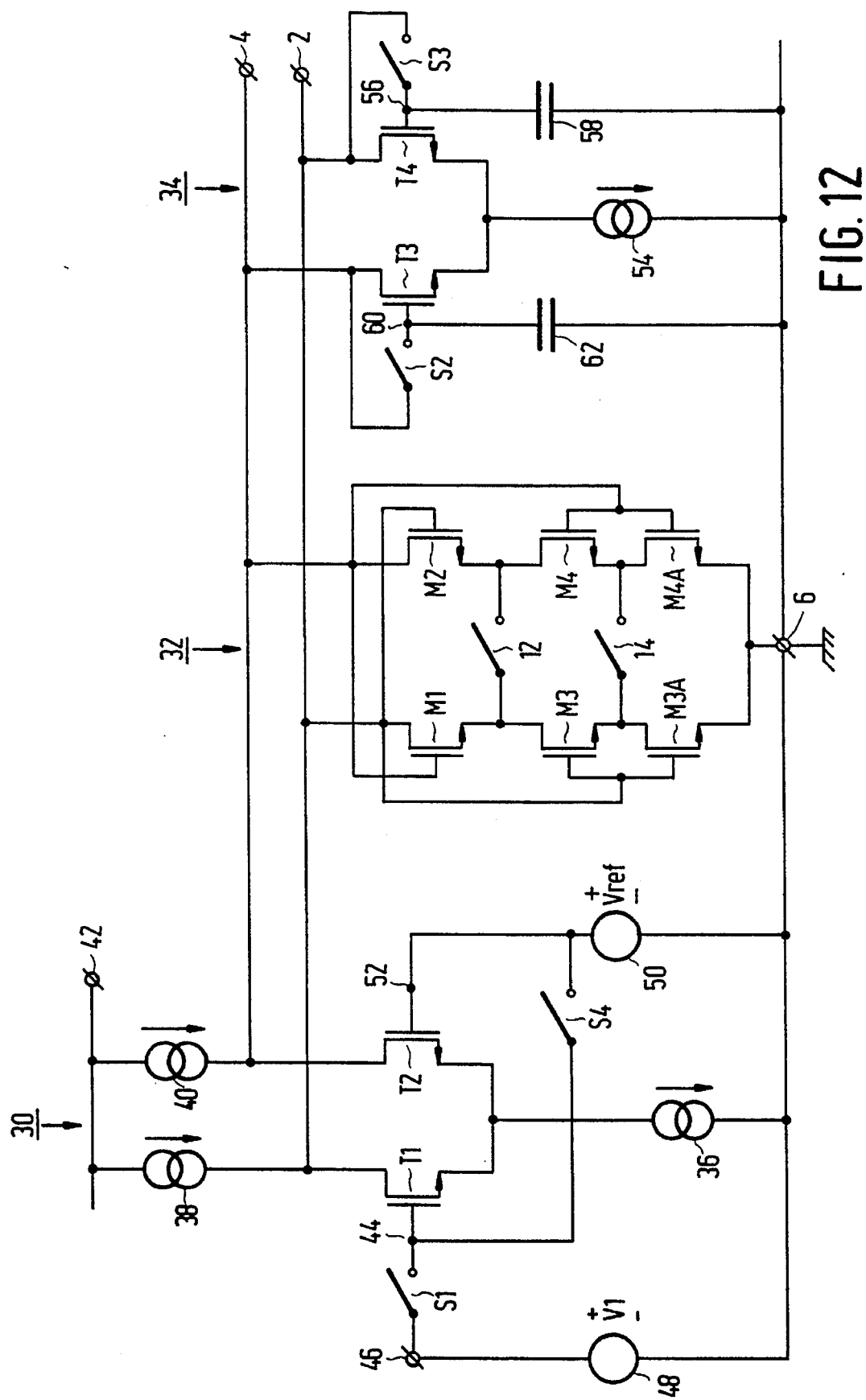
FIG. 12 shows a clocked comparator with a load stage in accordance with the invention.

The load stage in accordance with the invention is very suitable for use in a clocked comparator of a type as published in European Patent Application EP 0,509,585. The diagram of the clocked comparator is shown in FIG. 12. The clocked comparator has an input stage 30, a load stage 32 in accordance with the invention, and a sample-and-hold circuit 34.

The input stage 30 comprises a differential amplifier with two transistors T1 and T2, whose sources are connected to the third terminal 6 via a current source 36, and whose drains are connected to a supply terminal 42 via a current source 38 and 40, respectively. A node 44, to which the gate of the transistor T1 is connected, is connected to an input terminal 46 of the clocked comparator via a switch S1, to which comparator an input voltage source 48 can be connected to supply an input voltage V1 relative to the third terminal 6. A reference voltage source 50 for supplying a reference voltage Vref is connected between the third terminal 6 and a node 52, to which the gate of the transistor T2 is connected. The node 52 can be connected to the node 44 via a switch S4, the switch S4 being operated in phase opposition to the switch S1. The drains of the transistors T1 and T2 are connected to the first terminal 2 and the second terminal 4, which terminals also function as the balanced output terminals of the clocked comparator.

The sample-and-hold circuit 34 comprises a differential amplifier with two transistors T3 and T4, whose sources are connected to the third terminal 6 via a current source 54. The gate of the transistor T4 is a first input of the sample-and-hold circuit 34 and is connected, via a node 56, to a capacitor 58 and to a switch S3, by means of which the gate and drain of the transistor T4 can be interconnected. The gate of the transistor T3 is a second input of the sample-and-hold circuit 34 and is connected, via a node 60, to a capacitor 62 and to a switch S2, by means of which the gate and drain of the transistor T3 can be interconnected. The switches S2 and S3 operate in phase with the switch S1. The drains of the transistors T4 and T3 are connected to the first terminal 2 and the second terminal 4, respectively.

The load stage 32 is of the type as shown in FIG. 9 but the transistors M3B and M4B and the switch 16 shown in this Figure have been omitted. The transistors M3, M3A, M4 and M4A have the same geometry W/L and, consequently, have the same current gain factor B. The transistors M1 and M2 have a geometry 3*W/L.

The clocked comparator operates as follows. In a signal sampling phase the switches S1, S2, S3 and 14 are closed, the other switches being open. The load stage 32 now forms a comparatively high positive impedance, yielding a high gain. The input signal V1 is now applied to the terminals 2 and 4 via the input stage 30 and is stored in the capacitors 58 and 62. Subsequently the switches S1, S2 and S3 are opened and the switch S4 is closed. The voltage difference between the nodes 56 and 60 on the capacitors 58 and 62 is proportional to the voltage difference V1−Vref applied to the differential amplifier T1/T2. When the switch S4 is closed the difference current, which is supplied by the differential amplifier T1/T2, is determined only by the offset voltage. Simultaneously with the closure of the switch S4 the switch 14 is opened so that the load stage 32 forms a comparatively low positive impedance. The current difference supplied by the differential amplifier T1/T2 now corresponds to the offset errors. The current difference supplied by the sample-and-hold circuit 34 corresponds to the input signal V1 minus the reference voltage Vref and including the offset errors. The result is that the current difference is proportional to V1−Vref alone, i.e. without offset errors. Subsequently, the switch 12 is closed so that the load stage 32 forms a negative impedance and the latching phase begins, in which the voltage difference between the terminals 2 and 4 is latched.

The switches shown in the embodiments may be replaced by MOS switching transistors. The shown NMOS transistors may be replaced by PMOS transistors.

I claim:

1. A clocked comparator for comparing an input voltage and a reference voltage, said input voltage appearing at a first input terminal of the clocked comparator during a first state of a clock signal to an output voltage appearing between a first and a second output terminal of the clocked comparator during a second state of the clock signal, the reference voltage being coupled to a second input terminal the clocked comparator comprises:

an input differential amplifier having a first and a second input, and having a first and a second output coupled to the first and the second output terminal, respectively, first switching means for coupling the input voltage to the first and the second input of the differential amplifier during the first state of the clock signal, a sample-and-hold circuit comprising a differential amplifier having a first input coupled to a first capacitor and having a second input coupled to a second capacitor and second and third switching means for coupling respectively the first and the second input of the differential amplifier of the sample-and-hold circuit to the second and the first output terminal during the first state of the clock signal, fourth switching means for coupling the reference voltage both to the first and to the second input of the input differential amplifier during a third state of the clock signal, the third state occurring after the first state and before the second state of the clock signal, a load stage comprising a first, a second, a third, a fourth, a fifth and a sixth transistor, each having a gate, a source and a drain, and comprising a first switch and a second switch, the drain of the first transistor and the gates of the second, the third and the fifth transistor being coupled to the first output terminal, the drain of the second transistor and the gates of the first, the fourth and the sixth transistor being coupled to the second output terminal, the source of the first transistor being coupled to the drain of the third transistor, the source of the second transistor being coupled to the drain of the fourth transistor, the source of the third transistor being coupled to the drain of the fifth transistor, and the source of the fourth transistor being coupled to the drain of the sixth transistor, the sources of the fifth and the sixth transistor being coupled to a point of fixed potential, the first switch being connected between the sources of the first and the second transistor and the second switch being connected between the sources of the third and the fourth (M4) transistor, which first switch is closed in the second state of the clock signal and which second switch is closed in the first state of the clock signal and is open in the third state of the clock signal.

* * * * *